United States Patent
Shin et al.

(10) Patent No.: US 10,860,222 B2
(45) Date of Patent: Dec. 8, 2020

(54) MEMORY DEVICES PERFORMING REFRESH OPERATIONS WITH ROW HAMMER HANDLING AND MEMORY SYSTEMS INCLUDING SUCH MEMORY DEVICES

(71) Applicant: Samsung Electronics Co., Ltd., Suwon-si (KR)

(72) Inventors: Hoon Shin, Hwaseong-si (KR); Do-Yeon Kim, Seoul (KR); Ho-Young Song, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 16/354,473

(22) Filed: Mar. 15, 2019

(65) Prior Publication Data

US 2019/0347019 A1    Nov. 14, 2019

(30) Foreign Application Priority Data

May 9, 2018    (KR) .................. 10-2018-0053196

(51) Int. Cl.
  *G06F 3/06* (2006.01)
  *G11C 11/406* (2006.01)
  *G06F 12/02* (2006.01)

(52) U.S. Cl.
  CPC .......... *G06F 3/0622* (2013.01); *G06F 3/0629* (2013.01); *G06F 3/0679* (2013.01); *G06F 12/0207* (2013.01); *G11C 11/406* (2013.01); *G06F 2212/25* (2013.01)

(58) Field of Classification Search
  CPC .... G06F 3/0679; G06F 3/0629; G06F 3/0622; G06F 12/0207; G11C 11/406
  USPC .................................. 711/103, 163
  See application file for complete search history.

(56) References Cited

U.S. PATENT DOCUMENTS

| | | |
|---|---|---|
| 8,775,725 B2 | 7/2014 | Bains |
| 9,032,141 B2 | 5/2015 | Bains et al. |
| 9,972,377 B2 | 5/2018 | Oh et al. |
| 2014/0006703 A1 | 1/2014 | Bains et al. |
| 2014/0181449 A1 | 6/2014 | Kwon et al. |
| 2014/0189228 A1 | 7/2014 | Greenfield et al. |
| 2015/0058549 A1* | 2/2015 | Jeffrey .............. G11C 7/02 711/106 |
| 2015/0170733 A1 | 6/2015 | Lee et al. |

(Continued)

FOREIGN PATENT DOCUMENTS

| | | |
|---|---|---|
| KR | 10-1731508 | 4/2017 |
| KR | 10-2017-0077321 | 7/2017 |

*Primary Examiner* — Hua J Song
(74) *Attorney, Agent, or Firm* — Myers Bigel, P.A.

(57) ABSTRACT

Provided are memory devices configured to perform row hammer handling operations, and memory systems including such memory devices. An example memory device may include a memory cell array including a plurality of memory cell rows; a row hammer handler that is configured to determine whether to perform a row hammer handling operation to refresh adjacent memory cell rows adjacent to a first row that is being intensively accessed from among the memory cell rows, resulting in a determination result; and a refresh manager configured to perform either a normal refresh operation for sequentially refreshing the memory cell rows or the row hammer handling operation, based on the determination result of the row hammer handler.

17 Claims, 14 Drawing Sheets

(56) References Cited

U.S. PATENT DOCUMENTS

2015/0212742 A1 7/2015 Matsuzawa
2015/0243338 A1 8/2015 Sohn et al.
2015/0279441 A1 10/2015 Greenberg et al.
2016/0276015 A1 9/2016 Bains et al.

* cited by examiner

US 10,860,222 B2

MEMORY DEVICES PERFORMING REFRESH OPERATIONS WITH ROW HAMMER HANDLING AND MEMORY SYSTEMS INCLUDING SUCH MEMORY DEVICES

CROSS-REFERENCE TO RELATED APPLICATION

This application claims the benefit of Korean Patent Application No. 10-2018-0053196, filed on May 9, 2018, in the Korean Intellectual Property Office, the disclosure of which is incorporated by reference herein in its entirety.

TECHNICAL FIELD

The present disclosure relates to memory devices and memory systems that include memory devices, and more particularly, the present disclosure relates to memory devices that perform row hammer handling for reducing occurrences of row hammer phenomenon by precharging a word line adjacent to a word line being frequently accessed, and to memory systems including the memory device.

BACKGROUND

A memory device is a storage device, and can be implemented using semiconductors such as silicon (Si), germanium (Ge), gallium arsenide (GaAs), and indium phosphide (InP). Memory devices may be classified into volatile memory devices and non-volatile memory devices.

A non-volatile memory device is a memory device in which data stored therein does not disappear even when power supply is interrupted. Examples of non-volatile memory devices may include NAND flash memories, vertical NAND flash memories, NOR flash memories, resistive random access memories (RAMS), phase-change memories, magnetoresistive random access memories (MRAMs), and so on.

A volatile memory device is a memory device in which data stored therein disappears when power supply is interrupted. Examples of volatile memory devices may include static random access memories (SRAMs), dynamic random access memories (DRAMs), latches, flip-flops, registers, and so on.

A volatile memory device, such as DRAM, determines data based on charges stored in a capacitor. However, since charges stored in a capacitor may leak in various forms over time, a volatile memory device periodically performs refresh operations. As processes for manufacturing memory devices are scaled down and intervals between word lines become narrower, due to a voltage distribution of a word line, the influence of charges of a memory cell connected to another word line adjacent to the word line increases. When one word line is intensively accessed, a row hammer phenomenon occurs, that is, due to a voltage of the active state of one word line, data stored in memory cells connected to other word lines adjacent to the word line is lost.

SUMMARY

The present disclosure provides memory devices that are configured to reduce an effect of a row hammer phenomenon and/or a rate of occurrence of a row hammer phenomenon through efficient row hammer handling.

The present disclosure also provides memory systems that include memory devices that are configured to reduce an effect of a row hammer phenomenon and/or a rate of occurrence of a row hammer phenomenon through efficient row hammer handling.

Some aspects of the inventive concepts provide a memory device that may include: a memory cell array having a plurality of memory cell rows; a row hammer handler configured to determine whether to perform a row hammer handling operation to refresh adjacent memory cell rows of the plurality of memory cell rows that are adjacent to a first row of the plurality of memory cell rows that is intensively accessed; and a refresh manager configured to perform either a normal refresh operation for sequentially refreshing the memory cell rows or the row hammer handling operation based on a determination result from the row hammer handler.

According to some aspects of the inventive concepts, there is provided a memory system that may include a memory device including a memory cell array including a plurality of memory cell rows, and a refresh manager configured to refresh at least some of the memory cell rows; and a memory controller configured to output a command for performing an access to the memory device to the memory device. The memory device may be configured to perform a first row hammer handling operation to refresh adjacent memory cell rows that are adjacent to a first row of the plurality of memory cell rows that is intensively accessed based on an access count, which may be a result of counting accesses to the memory cell array.

According to some aspects of the inventive concepts, there is provided a method of refreshing a memory device including a memory cell array, the method including counting accesses to the memory cell array and generate an access count; comparing the access count to a reference count; and refreshing adjacent memory cell rows adjacent to a first row that is intensively accessed when the access count is equal to or greater than the reference count; or sequentially refreshing a plurality of memory cell rows included in the memory cell array when the access count is less than the reference count.

DETAILED DESCRIPTION OF THE EMBODIMENTS

Figure 1:
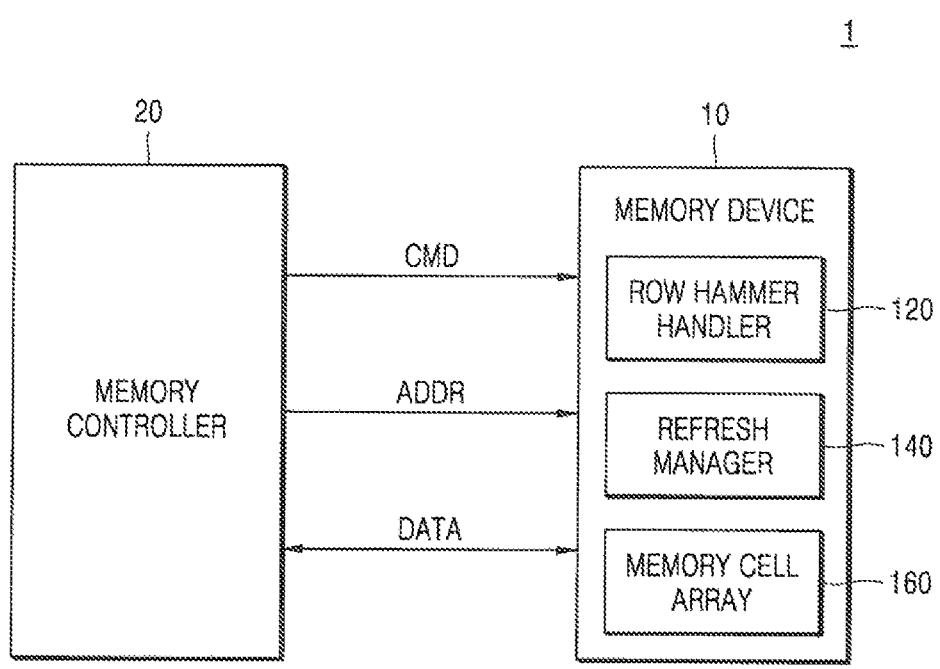
FIG. 1 is a block diagram showing a memory system according to some aspects of the present disclosure.

FIG. 1 is a block diagram showing a memory system according to some aspects of the present disclosure.

Referring to FIG. 1, a memory system 1 may include a memory device 10 and a memory controller 20.

The memory controller 20 may provide various signals to the memory device 10 through a memory interface, thereby controlling memory operations like writing and reading. For example, the memory controller 20 may access data DATA of a memory cell array 160 by providing a command CMD and an address ADDR to the memory device 10. The command CMD may include, as examples, an active command for a normal memory operation like writing and reading data, a precharge command, and/or a refresh command for a refresh operation. An active command may refer to a command for switching the state of the memory cell array 160 to an active state in order to write data to the memory cell array 160 or to read data from the memory cell array 160. According to the active command, memory cells included in the memory cell array 160 may be driven. Herein, the term 'access' may indicate that memory cell rows included in the memory cell array 160 are driven according to an active command of the memory controller 20.

A precharge command may refer to a command for switching the state of the memory cell array 160 from the active state to a standby state after data is written or read. A refresh command may refer to a command for performing a refresh operation on the memory cell array 160. The memory controller 20 may access the memory device 10 according to a request from a host outside the memory system 1. The memory controller 20 may communicate with a host by using various protocols.

The memory device 10 may be a storage device based on semiconductor devices. For example, the memory device 10 may be a random access memory (RAM) device, such as Dynamic Random Access Memory (DRAM), Synchronous DRAM (SDRAM), Static RAM (SRAM), Double Date Rate (DDR) SDRAM, DDR2 SDRAM, DDR3 SDRAM, Phase-change RAM (PRAM), Magnetic RAM (MRAM), and Resistive RAM (RRAM). In some aspects, the memory device 10 may be any memory device that needs a refresh operation. For example, some resistive memory devices, which are or include a non-volatile memory, may perform a refresh operation, and thus the memory device 10 may be a non-volatile memory device. The memory device 10 may receive and/or output data DATA via data lines, and/or may perform a refresh operation in response to the address ADDR and the command CMD received from the memory controller 20. The memory device 10 may include a row hammer handler 120, a refresh manager 140, and the memory cell array 160.

The row hammer handler 120 may determine whether to perform a row hammer handling operation in response to the refresh command of the memory controller 20. In other words, the row hammer handler 120 may determine whether to perform a row hammer handling operation or a normal refresh operation in response to the refresh command of the memory controller 20, and the row hammer handler 120 may output a result of the determination to the refresh manager 140. Herein, a "row hammer handling operation" may refer to an operation for reducing an effect of and/or occurrences of a row hammer phenomenon by refreshing a memory cell row adjacent to a memory cell row that is intensively accessed, whereas a "normal refresh operation" may refer to an operation for sequentially refreshing memory cell rows of the memory cell array 160. Herein, a memory cell row being intensively accessed may be referred to as an intensively-accessed memory cell row, whereas a memory cell row adjacent to the intensively-accessed memory cell row will be referred to as an adjacent memory cell row. Some examples in which it is determined that a memory cell row is being intensively accessed are provided herein with reference to e.g., FIGS. 5A to 10. Although FIG. 1 shows an example embodiment in which the row hammer handler 120 determines whether to perform a row hammer handling operation in response to a refresh command of the memory controller 20, it is merely an example, and it should be understood that the inventive concepts may also be applied to a self-refresh case in which a refresh operation is periodically performed inside the memory device 10.

The row hammer handler 120 according to the present disclosure may determine whether to perform a row hammer handling operation based on accesses to the memory cell array 160. In some embodiments, the row hammer handler 120 may determine whether to perform a row hammer handling operation based on an access count regarding the memory cell array 160. In some embodiments, the row hammer handler 120 may determine whether to perform a row hammer handling operation based on an access count regarding a particular area in the memory cell array 160. In some embodiments, the row hammer handler 120 may determine whether to perform a row hammer handling operation based on an access frequency indicating an access count regarding the memory cell array 160, or a portion or area thereof, during a reference time period. In some embodiments, the row hammer handler 120 may determine whether to perform a row hammer handling operation based on an access table including information about a memory cell row that is or has been intensively accessed.

The refresh manager 140 may perform a row hammer handling operation or a normal refresh operation based on a result of the determination of the row hammer handler 120. When the row hammer handler 120 determines to perform a row hammer handling operation, the refresh manager 140 may refresh an address corresponding to an adjacent memory cell row. When the row hammer handler 120 determines to perform a normal refresh operation, the refresh manager 140 may sequentially refresh a plurality of memory cell rows of the memory cell array 160.

The memory cell array 160 may include a plurality of memory cells. The memory cells may be respectively located at points where a plurality of word lines and a plurality of bit lines intersect each other. The memory cells are connected to the word lines and the bit lines. The memory cells may be provided in a matrix-like form. Herein, a "memory cell row" may refer to memory cells included in a single row from among the memory cells. The word lines may be connected to a plurality of memory cell rows of the memory cell array 160, respectively.

Figure 2:
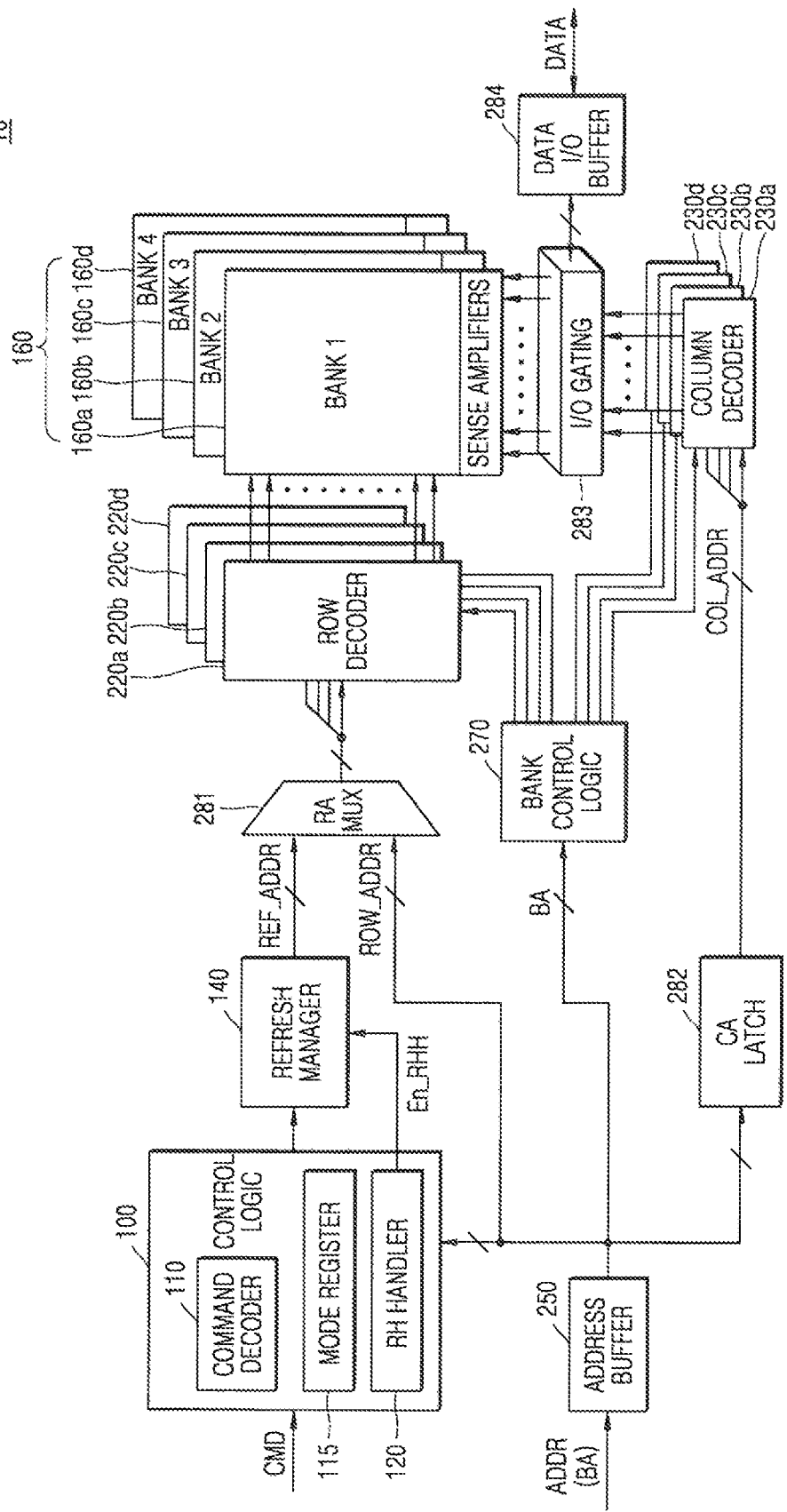
FIG. 2 is a block diagram showing a memory device according to some aspects of the present disclosure.

FIG. 2 is a block diagram showing a memory device according to aspects of the present disclosure. Descriptions identical to those given above with reference to FIG. 1 will be omitted.

Referring to FIG. 2, the memory device 10 may include a control logic 100, the refresh manager 140, the memory cell array 160, a plurality of row decoders, for example, first to fourth row decoders 220a to 220d, a plurality of column decoders, for example, first to fourth column decoders 230a to 230d, an address buffer 250, a bank control logic 270, a row address selector 281, a column address latch 282, an input/output gating circuit 283, and a data input/output buffer 284. Furthermore, the memory cell array 160 may include a plurality of banks, for example, first to fourth banks 160a to 160d, and a plurality of sense amplifiers respectively corresponding to the banks 160a to 160d may be provided.

The memory device 10 may be DRAM like DDR SDRAM, Low Power DDR (LPDDR) SDRAM, Graphics Double Data Rate (GDDR) SDRAM, and Rambus DRAM (RDRAM).

The control logic 100 may control the overall operation of the memory device 10 and may include a command decoder 110, a mode register 115, and the row hammer handler 120. The control logic 100 may generate control signals to perform a write operation or a read operation according to the command CMD from the memory controller 20 (FIG. 1). In addition, the control logic 100 may generate control signals for a refresh operation on the first to fourth banks 160a to 160d according to the refresh command from the memory controller 20 (FIG. 1). Alternatively, the control logic 100 may generate control signals for a refresh operation on the first to fourth banks 160a to 160d in a self-refresh mode. The mode register 115 may include a plurality of registers for storing information for setting an operating environment of the memory device 10. The command decoder 110 may output an access signal which corresponds to an access to the memory cell array 160 or a refresh command to the row hammer handler 120 based on the command CMD. For example, when the command CMD is an active command, the command decoder 110 may output an access signal to the row hammer handler 120. When the command CMD is a refresh command, the command decoder 110 may output a refresh command to the row hammer handler 120.

The address buffer 250 may receive the address ADDR provided from the memory controller 20. The address ADDR may include a bank address BA. Furthermore, the address ADDR may include a row address ROW_ADDR for indicating a row of the memory cell array 160 and a column address COL_ADDR for indicating a column of the memory cell array 160. The row address ROW_ADDR may be provided to the first to fourth row decoders 220a to 220d via the row address selector 281, whereas the column address COL_ADDR may be provided to the first to fourth column decoders 230a to 230d via the column address latch 282. Also, the bank address BA may be provided to the bank control logic 270. In some embodiments, the row address ROW_ADDR may be provided to the row hammer handler 120, and the row hammer handler 120 may determine whether to perform a row hammer handling operation based on the row address ROW_ADDR.

The bank control logic 270 may generate bank control signals in response to the bank address BA. Also, in response to the bank control signals, a row decoder from among the first to fourth row decoders 220a to 220d that corresponds to the bank address BA may be activated, and a column decoder from among the first to fourth column decoders 230a to 230d that corresponds to the bank address BA may be activated.

The row hammer handler 120 may output a row hammer handling enable signal En_RHH to the refresh manager 140 in response to the refresh command. The refresh manager 140 may generate a refresh address REF_ADDR for selecting a memory cell row to be refreshed in the memory cell array 160 based on the row hammer handling enable signal En_RHH. For example, when the row hammer handler 120 outputs logic high as the row hammer handling enable signal En_RHH to perform a row hammer handling operation, the refresh manager 140 may output the address of a preset adjacent memory cell row as a refresh address REF_ADDR.

For example, when the row hammer handler 120 outputs logic low as a row hammer handling enable signal En_RHH to perform a normal refresh operation, the refresh manager 140 may sequentially generate refresh addresses REF_ADDR, values of which may increase through a counting operation of a counter included in the refresh manager 140. The row address selector 281 may be implemented as a multiplexer and may output the row address ROW_ADDR provided from the memory controller 20 (FIG. 1) during data access and may output the refresh address REF_ADDR generated by the refresh manager 140 during a refresh operation. As described herein, (e.g., with reference to FIG. 3) the refresh address REF_ADDR indicating a row to be refreshed may be generated within the memory device 10. However, in some embodiments, the refresh address REF_ADDR may be provided directly from the memory controller 20 (FIG. 1).

Figure 3:
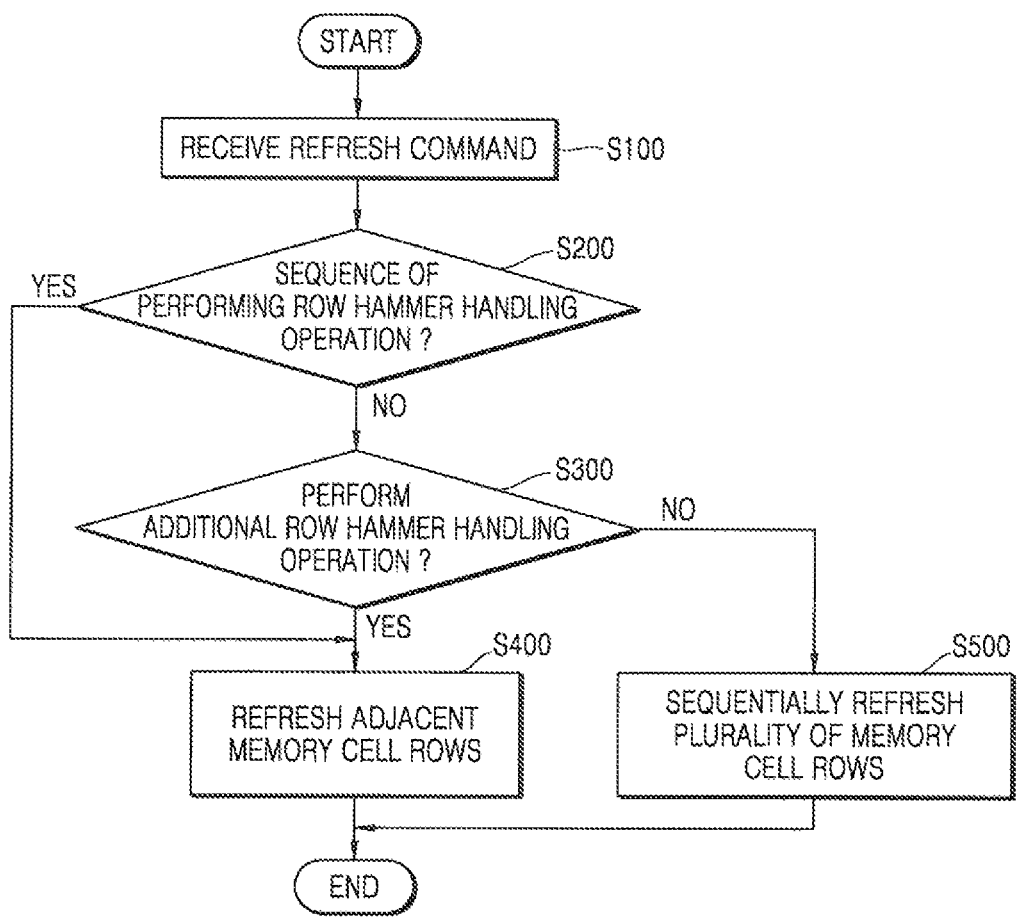
FIG. 3 is a flowchart showing operations of a memory device according to some aspects of the present disclosure.

FIG. 3 is a flowchart showing operations of a memory device according to aspects of the present disclosure.

Referring to FIGS. 1 and 3, the memory device 10 may receive a refresh command from the memory controller 20 (operation S100). According to some example embodiments, the memory device 10 may perform a row hammer handling operation instead of a normal refresh operation at a constant interval in response to a refresh command. Accordingly, the row hammer handler 120 may determine whether a row hammer handling operation in response to the refresh command is to be performed (operation S200). When the row hammer handler 120 determines that it is the case to perform a row hammer handling operation, the memory device 10 may perform a row hammer handling operation by performing a refresh operation on an adjacent memory cell row (operation S400).

Otherwise, when the row hammer handler 120 determines that it is not the case to perform a row hammer handling operation, the row hammer handler 120 may determine whether to perform an additional row hammer handling operation. In the case of performing an additional row hammer handling operation, the memory device 10 may perform a row hammer handling operation by performing a refresh operation on an adjacent memory cell row (operation S400). In the case of not performing an additional row hammer handling operation, the memory device 10 may perform a normal refresh operation by sequentially refreshing a plurality of memory cell rows (operation S500).

Figure 4:
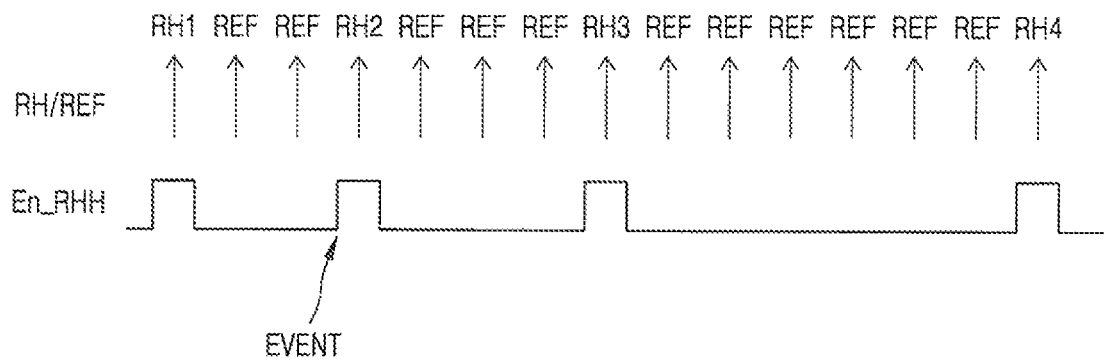
FIG. 4 is a timing diagram showing an operation of a refresh manager according to some aspects of the present disclosure.

FIG. 4 is a timing diagram showing in operation of a refresh manager according to aspects of the present disclosure. In detail, FIG. 4 shows that, in some embodiments, the memory device 10 may perform an additional row hammer handling operation RH2, in addition to periodic row hammer handling operations, such as row hammer handling operations RH1, RH3, and RH4). FIG. 4 shows an example embodiment in which the memory device 10 performs periodic row hammer handling operations RH1, RH3, and RH4 after performing a normal refresh operation REF six times.

Referring to FIGS. 2 and 4, the refresh manager 140 may perform row hammer handling operations RH1 to RH4 when the row hammer handling enable signal En_RHH received from the row hammer handler 220 is logic high and may perform a normal refresh operation REF when the row hammer handling enable signal En_RHH is logic low. Although the examples herein use the above described associations, the present disclosure is not limited thereto, and in some embodiments, the refresh manager 140 may perform row hammer handling operations RH1 to RH4 when the row hammer handling enable signal En_RHH received from the row hammer handler 120 is logic low and may perform a normal refresh operation REF when the row hammer handling enable signal En_RHH is logic high.

The row hammer handler 120 may transit the row hammer handling enable signal En_RHH to logic high to periodically perform row hammer handling operations RH1, RH3, and RH4 once every six times of the normal refresh operation REF. In correspondence thereto, the refresh manager 140 may periodically perform row hammer handling operations RH1, RH3, and RH4. According to the inventive concepts, when a preset event Event occurs, although it may be the case to perform a normal refresh operation REF, the row hammer handler 120 may transit the row hammer handling enable signal En_RHH to logic high to perform a row hammer handling operation RH2. Based thereon, the refresh manager 140 may further perform a row hammer handling operation RH2. Example embodiments in which the row hammer handler 120 determines the occurrence of an event will be described below with reference to FIGS. 5A to 10.

The memory device 10 according to the present disclosure may perform the additional row hammer handling operation RH2 in addition to the periodic row hammer handling operations RH1, RH3, and RH4 in correspondence to or based on the detected occurrence of an event Event. By adaptively performing row hammer handling operations, a row hammer phenomenon may be reduced.

Figure 5A:
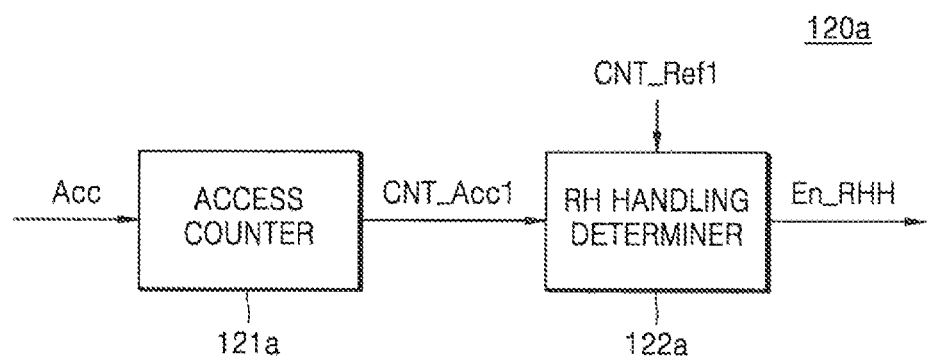
FIG. 5A is a block diagram showing a row hammer handler according to some aspects of the present disclosure.

FIG. 5A is a block diagram showing a row hammer handler according to aspects of the present disclosure.

Referring to FIG. 5A, a row hammer handler 120a may include an access counter 121a and a row hammer handling determiner 122a. The access counter 121a may count accesses Acc to the memory cell array 160 (FIG. 1) and may output an access count CNT_Acc1 to the row hammer handling determiner 122a. The row hammer handling determiner 122a may generate the row hammer handling enable signal En_RHH by comparing the access count CNT_Acc1 with a reference count CNT_Ref1 and may output the row hammer handling enable signal En_RHH to the refresh manager 140 (FIG. 1). In some embodiments, the row hammer handling determiner 122a may include a comparator.

Figure 5B:
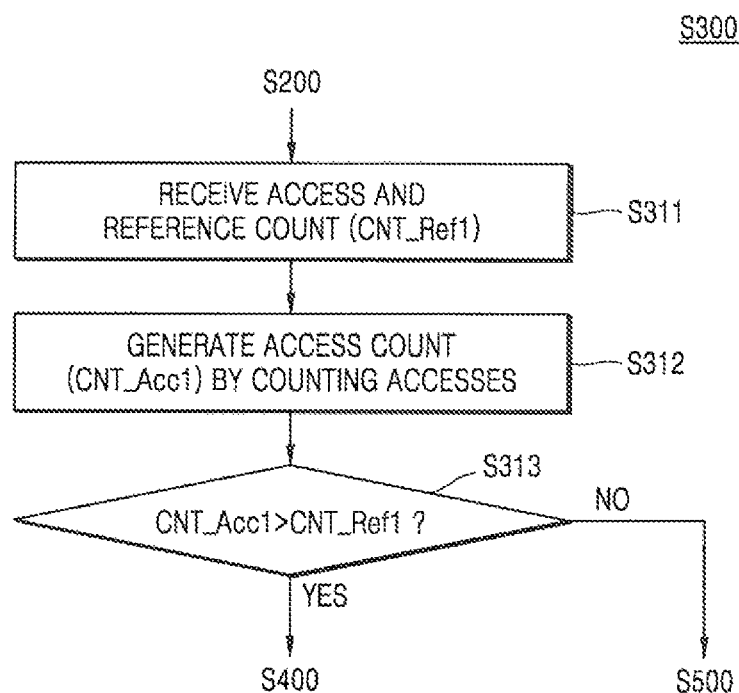
FIG. 5B is a flowchart showing operations of a row hammer handler according to some aspects of the present disclosure.

FIG. 5B is a flowchart showing operations of a row hammer handler according to some aspects of the present disclosure. In detail, FIG. 5B is a flowchart showing an example embodiment of an operation for determining whether to perform an additional row hammer handling operation, such as operation S300 in FIG. 3.

Referring to FIGS. 5A and 5B, the row hammer handler 120a may receive an access Acc including access information regarding the memory cell array 160 (FIG. 1) and the reference count CNT_Ref1 (operation S311). The row hammer handler 120a may generate the access count CNT_Acc1 by counting the accesses Acc (operation S312). The row hammer handler 120a may compare the access count CNT_Acc1 with the reference count CNT_Ref1 (operation S313). When the access count CNT_Acc1 is greater than the reference count CNT_Ref1, the row hammer handler 120a may output logic high as the row hammer handling enable signal En_RHH, and thus the refresh manager 140 (FIG. 1) may perform a row hammer handling operation (operation S400). Otherwise, when the access count CNT_Acc1 is not greater than the reference count CNT_Ref1, the row hammer handler 120a may output logic low as the row hammer handling enable signal En_RHH, and thus the refresh manager 140 (FIG. 1) may perform a normal refresh operation (operation S500).

Figure 6A:
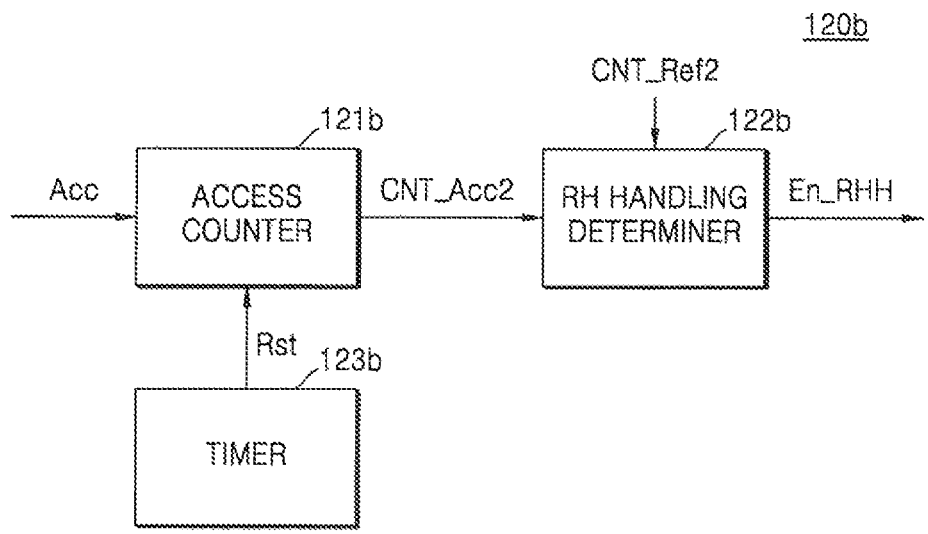
FIG. 6A is a block diagram showing a row hammer handler according to some aspects of the present disclosure.

FIG. 6A is a block diagram showing a row hammer handler according to some aspects of the present disclosure. Descriptions identical to those given above with reference to FIG. 5A will be omitted.

Referring to FIG. 6A, a row hammer handler 120b may include an access counter 121b, a row hammer handling determiner 122b, and a timer 123h. The timer 123b may output a reset signal Rst to the access counter 121b every preset reference time. Accordingly, the access counter 121b may output an access count CNT_Acc2, to the row hammer handling determiner 122b by counting the accesses Acc to the memory cell array 160 (FIG. 1) for a preset reference time. The access count CNT_Acc2 may refer to a frequency of accessing the memory cell array 160 (FIG. 1). The row hammer handling determiner 122b may generate the row hammer handling enable signal En_RHH by comparing the access count CNT_Acc2 with a reference count CNT_Ref2 and output the row hammer handling enable signal En_RHH to the refresh manager 140 (FIG. 1).

Figure 6B:
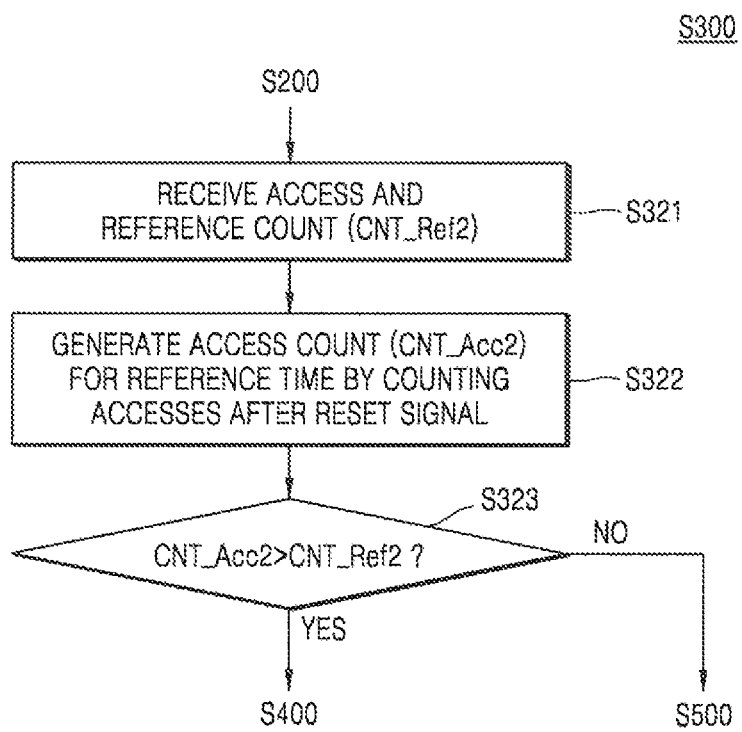
FIG. 6B is a flowchart showing operations of a row hammer handler according to some aspects of the present disclosure.

FIG. 6B is a flowchart showing operations of a row hammer handler according to sonic aspects of the present disclosure. In detail, FIG. 6B is a flowchart showing an example embodiment of an operation for determining whether to perform an additional row hammer handling operation, such as operation S300 in FIG. 3.

Referring to FIGS. 6A and 6B, the row hammer handler 120a may receive an access Acc including access information regarding the memory cell array 160 (FIG. 1) and the reference count CNT_Ref2 (operation S321). The row hammer handler 120b may generate the access count CNT_Acc2 by counting the accesses Acc after the reset signal Rst (operation S322). The row hammer handler 120*b* may compare the access count cMT_Acc2 with the reference count CNT_Ref2 (operation S323). When the access count CNT_Acc2 is greater than the reference count CNT_Ref2, the row hammer handler 120*b* may output logic high as the row hammer handling enable signal En_RHH, and thus the refresh manager 140 (FIG. 1) may perform a row hammer handling operation (operation S400). Otherwise, when the access count CNT_Acc2 is not greater than the reference count CNT_Ref2, the row hammer handler 120*b* may output logic low as the row hammer handling enable signal En_RHH and thus the refresh manager 140 (FIG. 1) may perform a normal refresh operation (operation S500).

Figure 7A:
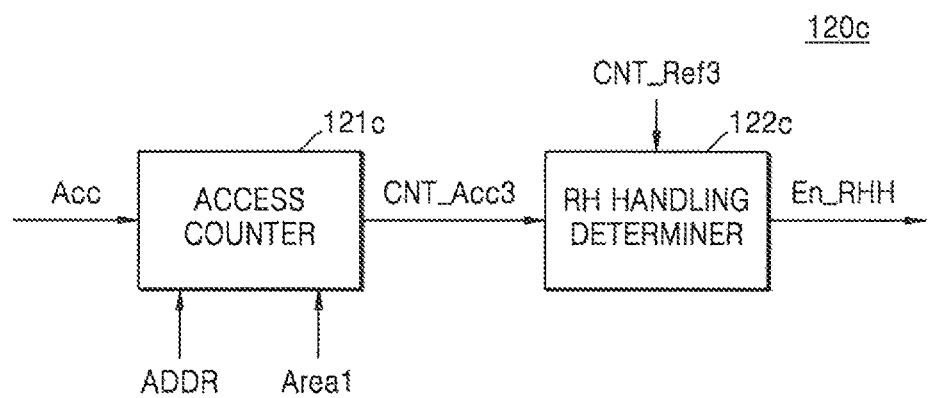
FIG. 7A is a block diagram showing a row hammer handler according to some aspects of the present disclosure.

FIG. 7A is a block diagram showing a row hammer handler according to aspects of the present disclosure. Descriptions identical to those given above with reference to FIG. 5A will be omitted.

Referring to FIG. 7A, a row hammer handler 120*c* may include an access counter 121*c* and a row hammer handling determiner 122*c*. The access counter 121*c* may receive the access Acc, the address ADDR corresponding to the access Acc, and a first area Area1 and, when the address ADDR is included in the first area Area1, count the access Acc corresponding to the address ADDR, thereby outputting an access count CNT_Acc3 to the row hammer handling determiner 122*c*. The address ADDR may refer to the address ADDR received from the memory controller 20 (FIG. 1). In other words, the access counter 121*e* may generate the access count CNT_Acc3 by counting the accesses Acc regarding the first area Area1 only. The row hammer handling determiner 122*c* may generate the row hammer handling enable signal En_RHH by comparing the access count CNT_Acc3 with a reference count CNT_Ref3 and output the row hammer handling enable signal En_RHH to the refresh manager 140 (FIG. 1).

Figure 7B:
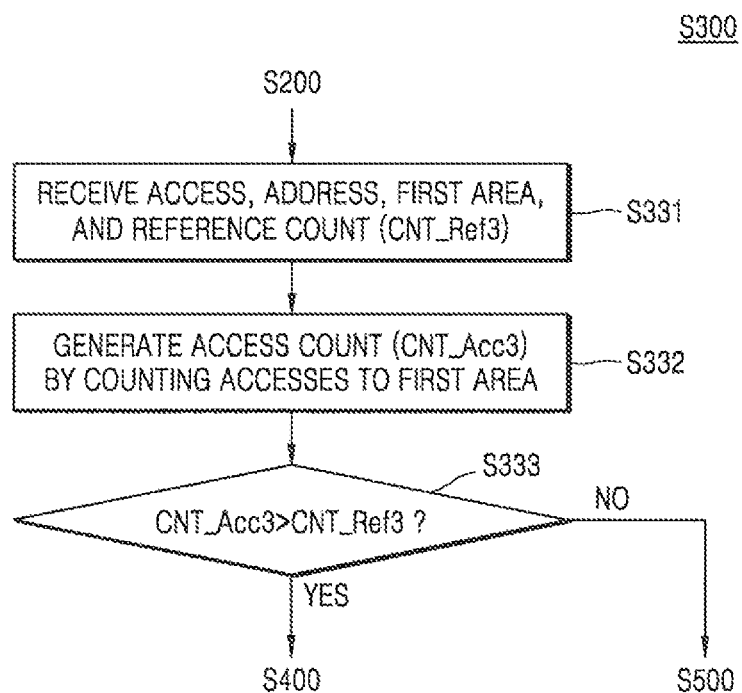
FIG. 7B is a flowchart showing operations of a row hammer handler according to some aspects of the present disclosure.

FIG. 7B is a flowchart showing operations of a row hammer handler according to aspects of the present disclosure. In detail, FIG. 7B is a flowchart showing an example embodiment of an operation for determining whether to perform an additional row hammer handling operation, such as operation S300 in FIG. 3.

Referring to FIGS. 7A and 7B, the row hammer handler 120*c* may receive the access Acc including access information regarding the memory cell array 160 (FIG. 1), the address ADDR corresponding to the access Acc, the first area Area1, and the reference count CNT_Ref3 (operation S331). The row hammer handler 120*c* may determine whether the access Acc is an access to the first area Area1 based on the address ADDR and generate the access count CNT_Acc3 by counting accesses Acc to the first area A1 only (operation S332). The row hammer handler 120*c* may compare the access count CNT_Acc3 with the reference count CNT_Ref1 (operation S333). When the access count CNT_Acc3 is greater than the reference count CNT_Ref3, the row hammer handler 120*c* may output logic high as the row hammer handling enable signal and thus the refresh manager 140 (FIG. 1) may perform a row hammer handling operation (operation S400). Otherwise, when the access count CNT_Acc3 is not greater than the reference count CNT_Ref3, the row hammer handler 120*c* may output logic low as the row hammer handling enable signal En_RHH, and thus the refresh manager 140 (FIG. 1) may perform a normal refresh operation (operation S500).

Figures 8A, 8B:
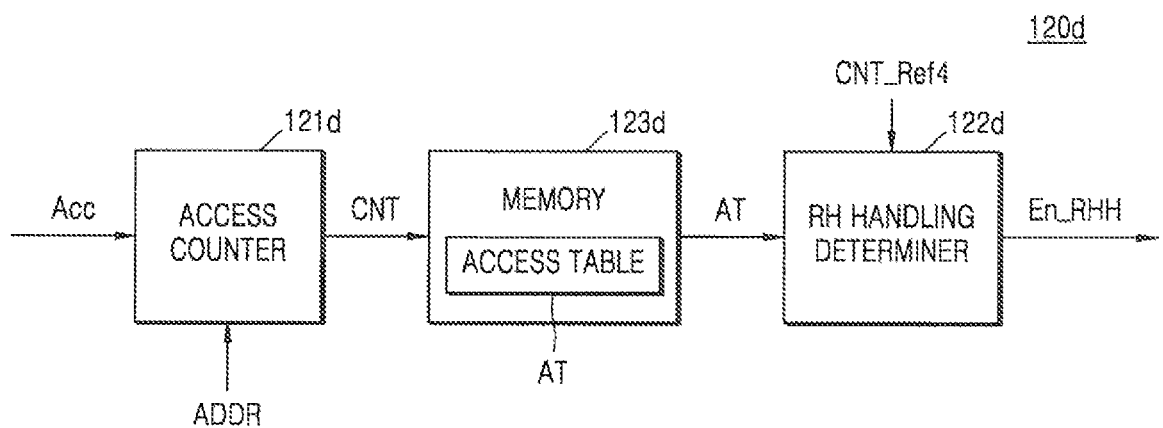
FIG. 8A is a block diagram showing a row hammer handler according to some aspects of the present disclosure.
FIGS. 8B and 8C are access tables according to some aspects of the present disclosure.

FIG. 8A is a block diagram showing a row hammer handler according to aspects of the present disclosure. Descriptions identical to those given above with reference to FIG. 5A will be omitted.

Referring to FIG. 8A, a row hammer handler 120*d* may include an access counter 121*d*, a row hammer handling determiner 122*d*, and a memory 123*d*. The access counter 121*d* may receive the access Acc and the address ADDR corresponding to the access Acc and count the access Acc corresponding to the address ADDR, thereby storing a row access count CNT in the memory 123*d*. The memory 123*d* may store an access table AT including information about the row access count CNT. The row hammer handling determiner 122*d* may read the access table AT from the memory 123*d* and generate an access count based on the access table AT. The row hammer handling determiner 122*d* may generate the row hammer handling enable signal En_RHH by comparing the access count with a reference count CNT_Ref4 and output the row hammer handling enable signal En_RHH to the refresh manager 140 (FIG. 1).

Figures 8C, 8D:
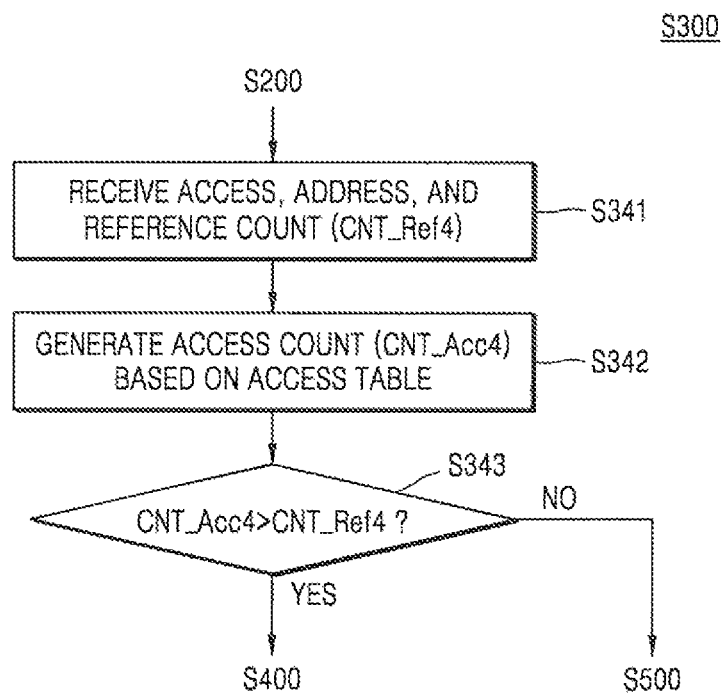
FIG. 8D is a flowchart showing operations of a row hammer handler according to some aspects of the present disclosure.

FIGS. 8B and 8C are access tables according to aspects of the present disclosure. In detail, FIGS. 8B and 8C are diagrams showing embodiments for generating an access count CNT_Acc4 in different ways.

Referring to FIGS. 8A through 8C, the access table AT may store row access counts CNT for respective memory cell rows. Also, the access table AT may sort the row access counts CNTs in order of rank Rank, which is the order of intensiveness of accesses. In other words, in the embodiment of FIGS. 8B and 8C, accesses may intensify in the order of the first memory cell row R1, the second memory cell row R2, the third memory cell row R3, and the fourth memory cell row R4. For example, the first memory cell row R1 may be a most intensively accessed row of the first through fourth memory cell rows R1-R4.

Referring to FIG. 8B, the row hammer handling determiner 122*d* may generate the access count CNT_Acc4 by adding the row access count CNT corresponding to at least some memory cell rows Row of the access table AT. In one embodiment, the at least some memory cell rows Row used to generate the access count CNT_Acc4 may be N (where N is a natural number) memory cell rows Row from the top ranks Rank. In other words, the row hammer handling determiner 122*d* may generate the access count CNT_Acc4 by adding the row access count CNT corresponding to the most intensively-accessed N memory cell rows Row. Therefore, the row hammer handling determiner 122*d* may generate 'C1+C2+C3', which is a sum of row access counts C1, C2, and C3 respectively corresponding to the three most intensively-accessed memory cell rows R1, R2, and R3, as the access count CNT_Acc4.

Referring to FIG. 8C, the row hammer handling determiner 122*d* may generate the access count CNT_Ref4 through a weighted sum of the row access counts CNT corresponding to at least some memory cell rows Row of the access table AT. In some embodiments, the row hammer handling determiner 122*d* may apply a higher weight for a memory cell row of a higher rank. The row hammer handling determiner 122*d* may generate 'a*C1+b*C2+c*C3', which is the weighted sum of the row access counts C1, C2, and C3 corresponding to the memory cell rows R2, and R3 of top three ranks, as the access count CNT_Acc4. Also, in some embodiments, a higher weight may be applied to a memory cell row of a higher rank, such that a may be natural number greater than b, and b may be a natural number greater than c.

Although FIGS. 8B and 8C show embodiments in which the access count CNT_Acc4 is generated using only the row access counts CNT regarding three memory cell rows, such embodiments are merely examples, and the inventive concepts may also be applied to an embodiment in which generating the access count CNT_Acc4 using the row access counts CNT is based on less or more than three memory cell rows.

FIG. 8B is a flowchart showing operations of a row hammer handler according to aspects of the present disclosure. In detail, FIG. 8D is a flowchart showing an example embodiment of an operation for determining whether to perform an additional row hammer handling operation, such as operation S300 in FIG. 3.

Referring to FIGS. 8A and 8D, the row hammer handler 120d may receive the access Acc including access information regarding the memory cell array 160 (FIG. 1), the address ADDR corresponding to the access Acc, and the reference count CNT_Ref4 (operation S341). The row hammer handler 120d may generate the access table AT based on the address ADDR and generate the access count CNT_Acc4 based on the generated access table AT (operation S342). In one embodiment, the row hammer handler 120d may generate the access count CNT_Acc4 by summing N (where N is a natural number) row access counts CNT of top ranks. In another embodiment, the row hammer handler 120d may generate the access ranking CNT_Acc4 through the weighted sum of N (where N a natural number) row access counts CNT of top ranks. The row hammer handler 120d may compare the access count CNT_Acc4 with the reference count CNT_Ref4 (operation S343). When the access count CNT_Acc4 is greater than the reference count CNT_Ref4, the row hammer handler 120d may then output logic high as the row hammer handling enable signal En_RHH, and thus the refresh manager 140 (FIG. 1) may perform a row hammer handling operation (operation S400). Otherwise, when the access count CNT_Acc4 is not greater than the reference count CNT_Ref4, the row hammer handler 120d may then output logic low as the row hammer handling enable signal En_RHH, and thus the refresh manager 140 (FIG. 1) may perform a normal refresh operation (operation S500).

Figure 9A:
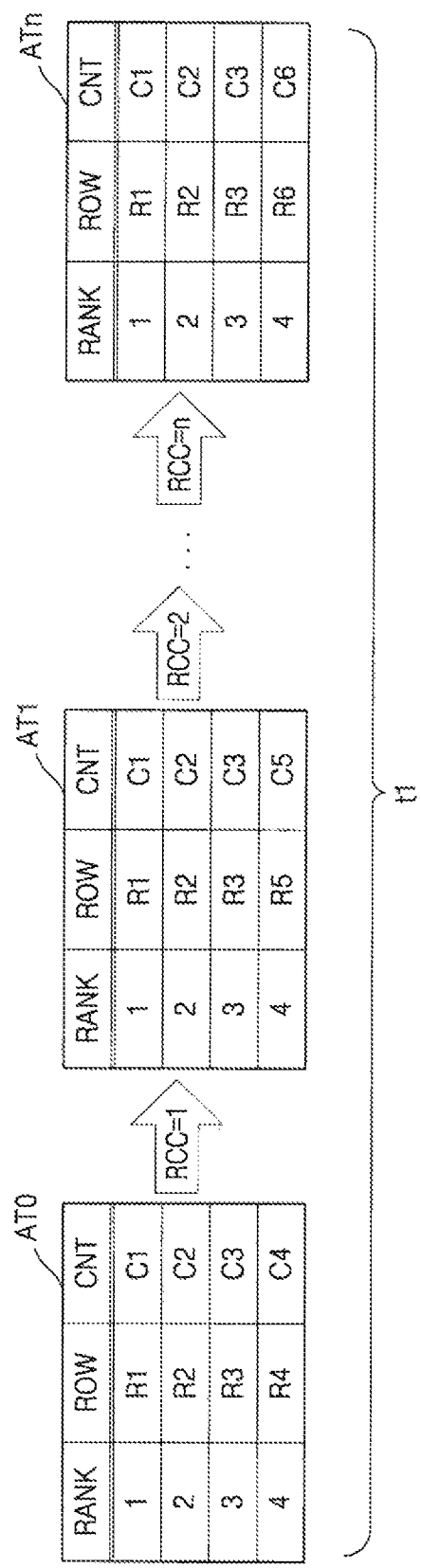
FIG. 9A is a diagram showing operations of a row hammer handler according to some aspects of the present disclosure.

FIG. 9A is a diagram showing operations of a row hammer handler according to aspects of the present disclosure.

Referring to FIGS. 8A and 9A, the row hammer handler 120d may store access tables AT differently according to the numbers of accesses to the respective memory cell rows of the memory controller 20 (FIG. 1) during a first time t1. In other words, a memory cell row corresponding to the fourth rank in the access table AT may vary according to the number of accesses to the respective memory cell row of the memory controller 20 (FIG. 1). As examples, the memory cell row corresponding to the fourth rank in a first access table AT0 is a fourth memory cell row R4. However, when a fifth memory cell row R5 is intensively-accessed thereafter, for example more intensively-accessed than the fourth memory cell row R4, then as shown in a second access table AT1, the memory cell row corresponding to the fourth rank may be changed to the fifth memory cell row R5.

The row hammer handler 120d may count the number of times a memory cell row corresponding to the lowest rank, and/or the lowest rank of the access table AT, is changed as described above. In the embodiment of FIG. 9A, when the first access table AT0 is changed to the second access table AT1, the row hammer handler 120d may count a row change count RCC as '1'. When the fourth rank is changed n times in the manner described above, the row hammer handler 120d may count the row change count RCC as 'n'.

According to some embodiments, the row hammer handler 120d may determine whether to perform a row hammer handling operation by comparing the row change count RCC with a reference count.

Figure 9B:
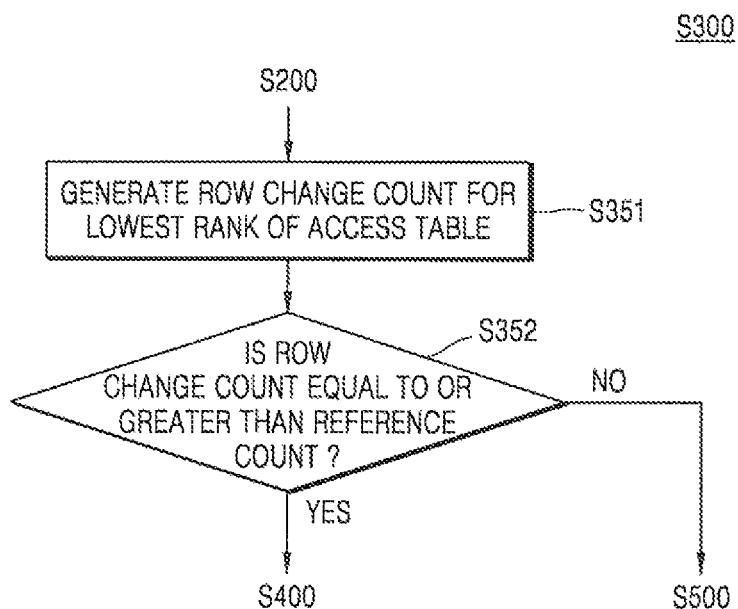
FIG. 9B is a flowchart showing operations of a row hammer handler according to some aspects of the present disclosure.

FIG. 9B is a flowchart showing operations of a row hammer handler according to aspects of the present disclosure. In detail, FIG. 9B is a flowchart showing an example embodiment of an operation for determining whether to perform an additional row hammer handling operation, such as operation S300 in FIG. 3.

Referring to FIGS. 9A and 9B, the row hammer handler 120d may generate a row change count for the lowest rank of an access table in the manner described above in FIG. 9A (operation S351). The row hammer handler 120d may compare the row change count with a reference count (operation S351). When the row change count is greater than the reference count, the row hammer handler 120d may output logic high as the row hammer handling enable signal En_RHH, and thus the refresh manager 140 (FIG. 1) may perform a row hammer handling operation (operation S400). Otherwise, when the row change count is not greater than the reference count, the row hammer handler 120d may output logic low as the row hammer handling enable signal and thus the refresh manager 140 (FIG. 1) may perform a normal refresh operation (operation S500).

Although FIG. 9B shows an example of an embodiment for determining whether to perform a row hammer handling operation by using a row change count for the lowest ranking, it is merely an example, and the inventive concepts may also be applied to an embodiment for determining whether to perform a row hammer handling operation by using a row change count for ranks other than the lowest rank.

Figure 10:
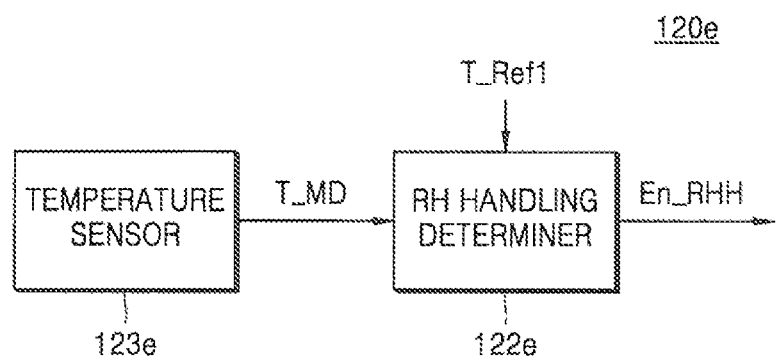
FIG. 10 is a block diagram showing a row hammer handler according to some aspects of the present disclosure.

FIG. 10 is a block diagram showing a row hammer handler according to aspects of the present disclosure. Descriptions identical to those given above with reference to FIG. 5A will be omitted.

Referring to FIG. 10, a row hammer handler 120e may include a temperature sensor 123e and a row hammer handling determiner 122e. The temperature sensor 123e may sense a temperature of the memory device 10 (FIG. 1) and output a sensed temperature T_MD to the row hammer handling determiner 122e. The row hammer handling determiner 122e may generate the row hammer handling enable signal En_RHH by comparing the sensed temperature T_MD with a reference temperature T_Ref and output the row hammer handling enable signal En_RHH to the refresh manager 140 (FIG. 1). In one embodiment, when the sensed temperature T_MD is higher than the reference temperature T_Ref, the row hammer handler 120d may output logic high as the row hammer handling enable signal En_RHH, and thus the refresh manager 140 (FIG. 1) may perform a row hammer handling operation.

When the sensed temperature T_MD is not higher than the reference temperature T_Ref, the row hammer handler 120d may output logic low as the row hammer handling enable signal En_RHH, and thus the refresh manager 140 (FIG. 1) may perform a normal refresh operation.

Figure 11A:
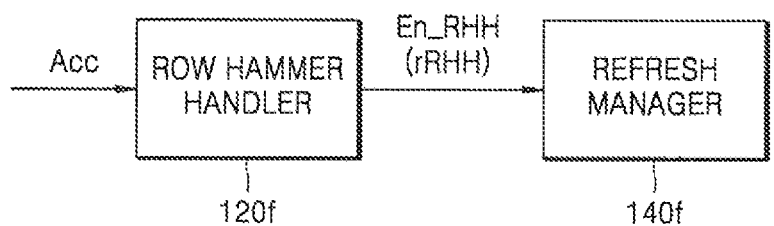
FIG. 11A is a block diagram showing a memory device according to some aspects of the present disclosure.

FIG. 11A is a block diagram showing a memory device according to aspects of the present disclosure.

Referring to FIG. 11A, a memory device 10f may include a row hammer handler 120f and a refresh manager 140f. The row hammer handler 120f may determine a row hammer handling ratio rRHH of the row hammer handling enable signal En_RHH based on the access Acc. Herein, the row hammer handling ratio rRHH may refer to a ratio between row hammer handling operations to normal refresh operations. When more row hammer handling operations need to be performed as the row hammer phenomenon becomes more intense and/or more frequent, the row hammer handler 120f may increase the row hammer handling ratio rRHH. On the other hand, when less row hammer handling operations need to be performed as the row hammer phenomenon is reduced and/or less frequent, the row hammer handler 120f may lower the row hammer handling ratio rRHH.

The row hammer handler 120f may determine the row hammer handling ratio rRHH in operations which are similar to the operations of determining whether to perform an additional row hammer handling operation described above with reference to FIGS. 5A to 10. In some embodiments, in operations which are similar to the operations described with reference to FIGS. 5A to 6B, the row hammer handler 120f may determine the row hammer handling ratio rRHH based on the number of accesses or an access frequency regarding the memory cell array 160 (FIG. 1). For example, the row hammer handler 120f may increase the row hammer handling ratio rRHH when the number of accesses is greater than a first reference count and may reduce the row hammer handling ratio rRHH when the number of accesses is less than a second reference count. For example, the row hammer handler 120f may increase the row hammer handling ratio rRHH when an access frequency is greater than a third reference count and may reduce the row hammer handling ratio rRHH when an access frequency is less than a fourth reference count.

In some embodiments, in operations which are similar to operations described with reference to FIGS. 7A and 7B, the row hammer handler 120f may determine the row hammer handling ratio rRHH based on an access count regarding a particular area in the memory cell array 160 (FIG. 1). In some embodiments, in operations which are similar to operations described with reference to FIGS. 8A to 9B, the row hammer handler 120f may determine the row hammer handling ratio rRHH based on an access table including information about intensively-accessed memory cell rows. In some embodiments, in operations which are similar to operations described with reference to FIG. 10, the row hammer handler 120f may determine the row hammer handling ratio rRHH based on a temperature of a memory device.

Figure 11B:
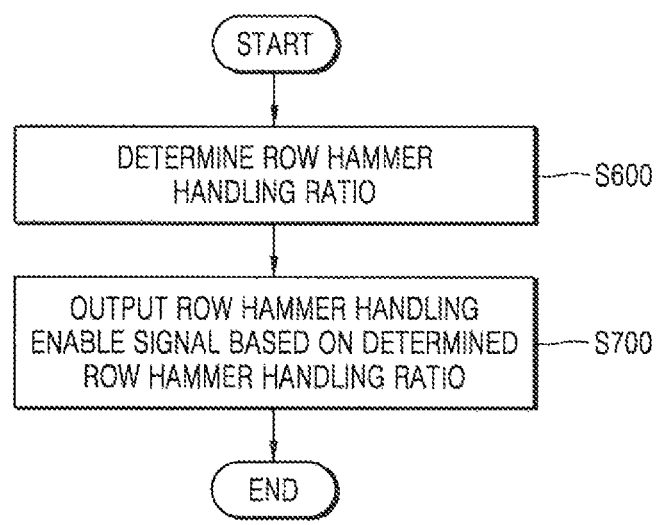
FIG. 11B is a flowchart showing operations of a row hammer handler according to some aspects of the present disclosure.

FIG. 11B is a flowchart showing operations of a row hammer handler according to aspects of the present disclosure.

Referring to FIGS. 11A and 11B, the row hammer handler 120f may determine the row hammer handling ratio rRHH. (operation S600). As described above with reference to FIG. 11A, the row hammer handler 120f may determine the row hammer handling ratio rRHH in operations similar to the operations of determining whether to perform an additional row hammer handling operation described above with reference to FIGS. 5A to 10. The row hammer handler 120f may output the row hammer handling enable signal En_RHH to the refresh manager 140f based on the determined row hammer handling ratio rRHH, and the refresh manager 140f may perform a normal refresh operation or a row hammer handling operation based on the row hammer handling enable signal En_RHH.

Figure 12A:
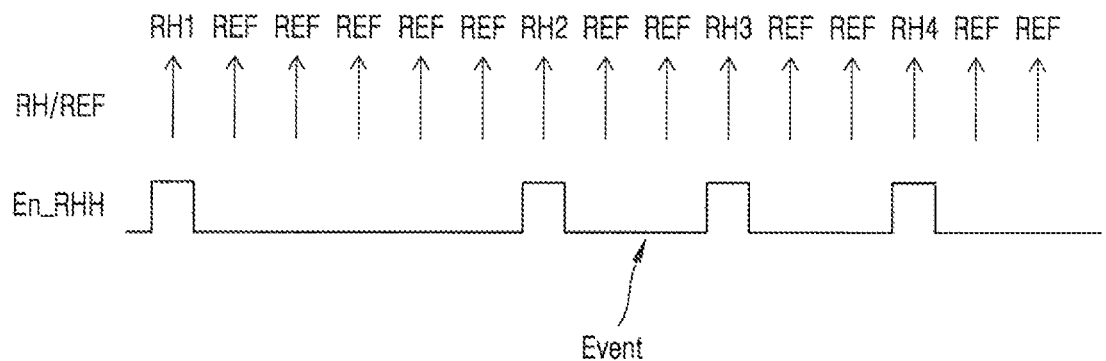
FIGS. 12A to 12C are timing diagrams showing operations, of a memory device according to some aspects of the present disclosure.
Figure 12B:
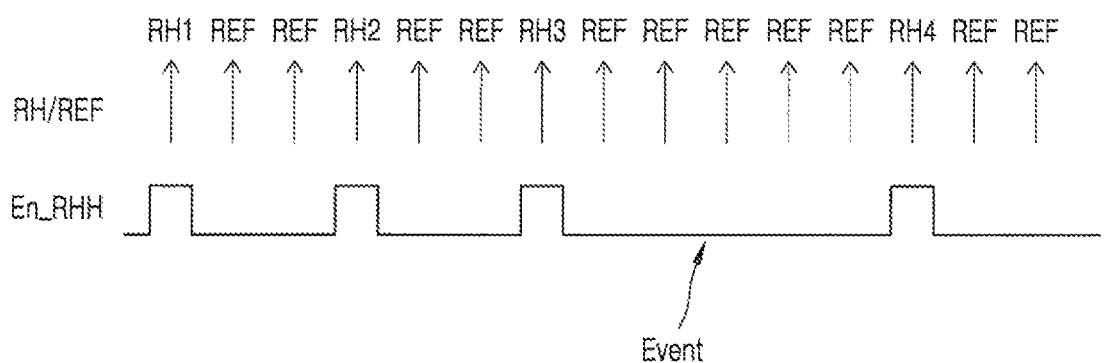
Figure 12C:
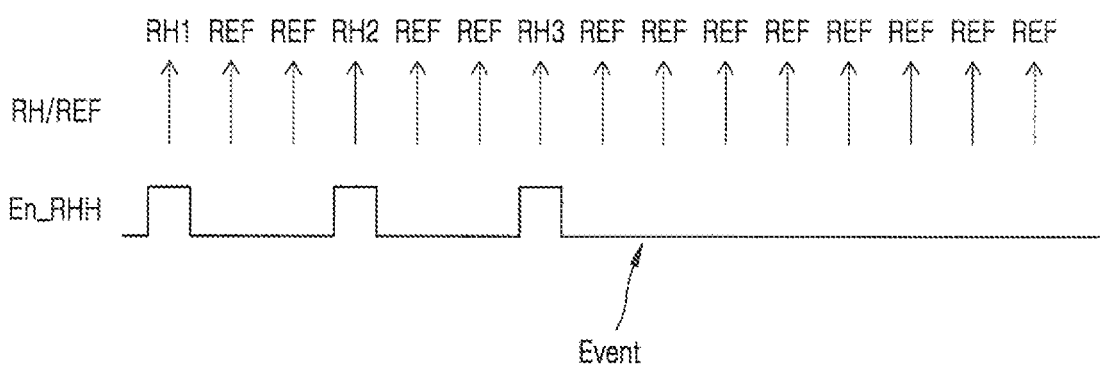

FIGS. 12A to 12C are timing diagrams showing operations of a memory device according to aspects of the present disclosure. In detail, FIGS. 12A to 12C show examples of embodiments in which a memory device changes a row hammer handling ratio in response to an event.

Referring to FIGS. 11A and 12A, the row hammer handler 120f may increase the row hammer handling ratio rRHH when the preset event Event occurs. In the embodiment of FIG. 12A, before the event Event occurs, the memory device 10f may have a 1/5 row hammer handling ratio rRHH for performing row hammer handling operations RH1 and RH2 once for every five refresh operations REF. When the preset event Event occurs, the memory device 10f may increase the row hammer handling ratio rRHH to 1/2, and the memory device 10f may perform row hammer handling operations RH3 and RH4 once for every two refresh operations REF based on a modified row hammer handling ratio rRHH. In some embodiments, the preset event Event may refer to a case where the number of accesses becomes greater than a reference count. In some embodiments, the preset event Event may refer to a case where an access frequency becomes greater than a reference count.

Referring to FIGS. 11A and 12B, the row hammer handler 120f may reduce the row hammer handling ratio rRHH when the preset event Event occurs. In the embodiment of FIG. 12B, before the event Event occurs, a memory device 10f may have an 1/2 row hammer handling ratio for performing periodic row hammer handling operations RH1, RH2, and RH3 once for every two refresh operations REF. When the preset event Event occurs, the memory device 10f may reduce the row hammer handling ratio rRHH to 1/5, and the memory device 10f may perform periodic row hammer handling operation RH4 once for every five refresh operations REF based on a modified row hammer handling ratio rRHH. In some embodiments, the preset event Event may refer to a case where the number of accesses becomes less than a reference count. In some embodiments, the preset event Event may refer to a case where an access frequency becomes less than a reference count.

Referring to FIGS. 11A and 12C, the row hammer handler 120f may change the row hammer handling ratio rRHH to 0 when the preset event Event occurs. In the embodiment of FIG. 12C, before the event Event occurs, a memory device 10f may have a 1/2 row hammer handling ratio for performing periodic row hammer handling operations RH1, RH2, and RH3 once for every two refresh operations REF. When the preset event Event occurs, the memory device 10f may reduce the row hammer handling ratio to 0, and thus the memory device 10f may temporarily or permanently cease to perform a periodic row hammer handling operation. In some embodiments, the preset event Event may refer to a case where the number of accesses becomes less than a reference count. In some embodiments, the preset event Event may refer to a case where an access frequency becomes less than a reference count.

Figure 13A:
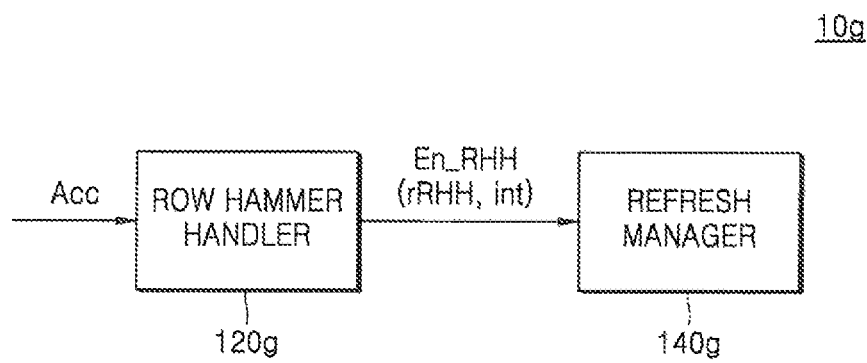
FIG. 13A is a block diagram showing a memory device according to some aspects of the present disclosure.

FIG. 13A is a block diagram showing a memory device according to aspects of the present disclosure.

Referring to FIG. 13A, a memory device 10g may include a row hammer handler 120g and a refresh manager 140g. The row hammer handler 120g may determine the row hammer handling ratio of the row hammer handling enable signal En_RHH and an interval int based on the access Acc. Herein, the interval int may refer to an interval between normal refresh operations and/or row hammer handling operations. As the row hammer handling ratio is changed, a refresh time for one memory cell row may be changed. The memory device 10g, according to some example embodiments, may maintain a refresh time even when the row hammer handling ratio rRHH is changed by adjusting the interval int.

The row hammer handler 120g may determine the interval int based on the row hammer handling ratio rRHH. In one embodiment, the row hammer handling ratio rRHH may be inversely proportional to the interval int. The row hammer handler 120g may output the row hammer handling enable signal En_RHH to the refresh manager 140g based on the row hammer handling ratio rRHH and the interval int.

Figure 13B:
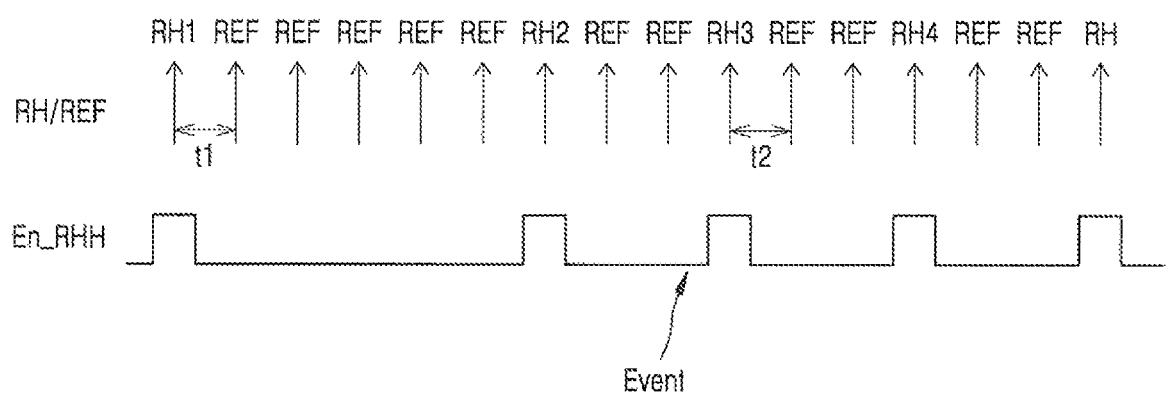
FIG. 13B is a timing diagram showing an operation of a memory device according to some aspects of the present disclosure.

FIG. 13B is a timing diagram showing an operation of a memory device according to aspects of the present disclosure. In detail, FIG. 13B shows an embodiment in which a memory device changes a row hammer handling ratio and an interval in response to an event.

Referring to FIGS. 13A and 13B, the row hammer handler 120g may increase the row hammer handling ratio rRHH when the preset event Event occurs. Also, the row hammer handler 120g may determine the interval int based on the row hammer handling ratio rRHH. In the embodiment of FIG. 13B, before the event Event occurs, the memory device 10g may have a 1/5 row hammer handling ratio for performing row hammer handling operations RH1 and RH2 once for every five refresh operations REF and the first time t1 as the interval int. When the preset event Event occurs, the memory device 10g may increase the row hammer handling ratio rRHH to 1/2 and determine a second time t2 as the interval int based on the row hammer handling ratio rRHH. The memory device 10g may perform a plurality of row hammer handling operations RH3 and RH4 and a plurality of refresh operation REFs based on a modified row hammer handling ratio rRHH and the interval int.

Figure 14:
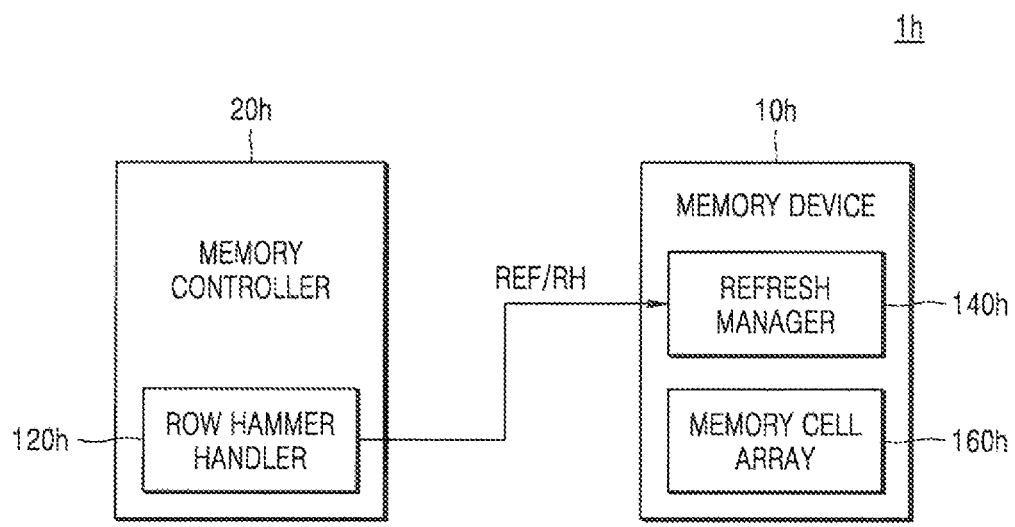
FIG. 14 is a block diagram showing a memory system according to some aspects of the present disclosure.

FIG. 14 is a block diagram showing a memory system according to aspects of the present disclosure. Descriptions identical to those given above with reference to FIG. 1 will be omitted.

Referring to FIG. 14, a memory system 1h may include a memory device 10h and a memory controller 20h, and the memory controller 20h may include a row hammer handler 120h. The row hammer handler 120h may determine whether to perform a row hammer handling operation in any manner described above with reference to FIGS. 1 to 13B and output either the refresh command REF or a row hammer handling command RH to a refresh manager 140h. The refresh manager 140h included in the memory device 10h may perform a refresh operation on a memory cell array 160h in response to the refresh command REF and perform a row hammer handling operation on the memory cell array 160h in response to the row hammer handling command RH.

Figure 15:
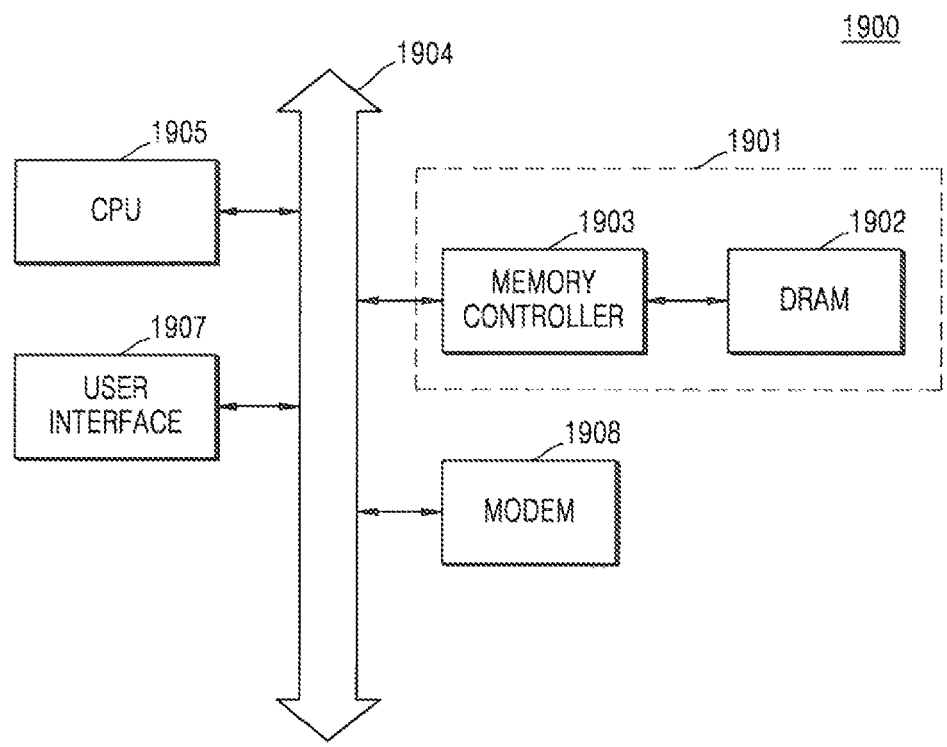
FIG. 15 is a block diagram showing a computer system according to some aspects of the present disclosure.

FIG. 15 is a block diagram showing a computer system according to aspects of the present disclosure.

Referring to FIG. 15, a computer system 1900 may be mounted on a mobile device, a desktop computer, etc. The computer system 1900 may include a DRAM memory system 1901, a CPU 1905, a user interface 1907, and a modem 1908 (e.g., a baseband chipset) that are electrically connected to a system bus 1904. The computer system 1900 may further be provided with an application chipset, a camera image processor (CIS), an input/output device, etc.

The user interface 1907 may be an interface for transmitting data to a communication network or receiving data from the communication network. The user interface 1907 may be a wired or wireless interface and may include an antenna or a wired/wireless transceiver. Data provided via the user interface 1907 or the modem 1908 or processed by the CPU 1905 may be stored in the DRAM memory system 1901.

The DRAM memory system 1901 may include any memory system as described above with reference to FIGS. 1 to 14. The DRAM memory system 1901 may include DRAM 1902 and a memory controller 1903. The DRAM 1902 stores data processed by the CPU 1905 or externally input. The DRAM 1902 may determine whether to perform an additional row hammer handling operation and adjust the number of row hammer handling operations for a memory cell array based thereon.

When the computer system 1900 is a device for performing wireless communication, the computer system 1900 may be used in a communication system such as a Code Division Multiple Access (CDMA) system, a Global System for Mobile communication (GSM) system, a North American Multiple Access (NADC) system, a Time Division Multiple Access (TDMA) system, and/or a CDMA2000 system, as examples. The computer system 1900 may be mounted in an information processing device such as a personal digital assistant (PDA), a portable computer, a web tablet, a digital camera, a Portable Media Player (PMP), a mobile phone, a wireless phone, or a laptop computer, as examples.

While the inventive concepts have been particularly shown and described with reference to embodiments thereof, it will be understood that various changes in form and details may be made therein without departing from the scope of the following claims.

What is claimed is:

1. A memory device comprising:
a memory cell array including a plurality of memory cell rows;
a row hammer handler configured to determine whether to perform a row hammer handling operation to refresh adjacent memory cell rows of the plurality of memory cell rows that are adjacent to a first row of the plurality of memory cell rows that is intensively accessed, resulting in a determination result; and
a refresh manager configured to perform a normal refresh operation for sequentially refreshing the memory cell rows or the row hammer handling operation based on the determination result,
wherein the row hammer handler is configured to count a number of accesses to a particular area of the memory cell array, the particular area including all of or at least two rows of the plurality of memory cell rows, and
wherein the determination result indicates to the refresh manager to perform the row hammer handling operation when an access count of the number of accesses to the particular area is equal to or greater than a first reference count, and indicates to the refresh manager to perform the normal refresh operation when the access count of the number of accesses to the particular area is less than the first reference count.

2. The memory device of claim 1, wherein the row hammer handler is configured to count the number of accesses to the particular area of the memory cell array during a reference time, and wherein the determination result indicates to the refresh manager to perform the row hammer handling operation when the access count of the number of accesses to the particular area of the memory cell array during the reference time is equal to or greater than a second reference count.

3. The memory device of claim 1, wherein the row hammer handler determines whether to perform the row hammer handling operation based on a number of accesses to a first area in the memory cell array.

4. The memory device of claim 1, further comprising a first memory configured to store an access table that includes access information regarding a first memory cell row group from among the plurality of memory cell rows,
wherein the row hammer handler determines whether to perform the row hammer handling operation based on the access table.

5. The memory device of claim 4, wherein the row hammer handler is further configured to obtain a plurality of access counts for at least some of the memory cell rows of the first memory cell row group, and wherein the determination result indicates to the refresh manager to perform the row hammer handling operation when a sum of the plurality of access counts is equal to or greater than a third reference count.

6. The memory device of claim 4, wherein the row hammer handler is further configured to obtain a plurality of access counts for at least some of the memory cell rows of the first memory cell row group, and wherein the determination result indicates to the refresh manager to perform the row hammer handling operation when a weighted sum of the plurality of access counts is equal to or greater than a fourth reference count.

7. The memory device of claim 4, wherein the determination result indicates to the refresh manager to perform the row hammer handling operation when a row change count is equal to or greater than a fifth reference count, wherein the row change count is a number of times that an address of a memory cell row included in the first memory cell row group is changed during a reference time.

8. The memory device of claim 1, wherein the determination result indicates to the refresh manager to perform a second row hammer handling operation subsequent to performance of N first normal refresh operations after a first row hammer handling operation (where N is a preset natural number) and, wherein, subsequent to occurrence of a preset event, the determination result indicates to the refresh manager to perform a third row hammer handling operation instead of at least one of the N first normal refresh operations.

9. The memory device of claim 1, wherein the row hammer handler determines whether to perform the row hammer handling operation based on a row hammer handling ratio between a number of normal refresh operations and a number of row hammer handling operations and, wherein the row hammer handler is further configured to adjust the row hammer handling ratio based on occurrence of a preset event.

10. The memory device of claim 9, wherein
the row hammer handler is configured to adjust an interval between the normal refresh operation and the row hammer handling operation, based on the adjusted row hammer handling ratio.

11. A memory system comprising:
a memory device including a memory cell array comprising a plurality of memory cell rows, and a refresh manager configured to refresh at least some of the memory cell rows; and
a memory controller configured to output to the memory device a command for performing an access to the memory device,
wherein the memory device is configured to perform a first row hammer handling operation to refresh adjacent memory cell rows that are adjacent to a first row of the plurality of memory cell rows that is intensively accessed when an access count of accesses to a particular area of the memory cell array is equal to or greater than a first reference count, the particular area including all of or at least two rows of the plurality of memory cell rows, and wherein the memory device is configured to sequentially refresh a plurality of memory cell rows included in the memory cell array when the access count to the particular area is less than the first reference count.

12. The memory system of claim 11, wherein the count of the particular area of the memory cell array is smaller than an entire area of the memory cell array.

13. The memory system of claim 11, wherein
the memory device is configured to perform a second row hammer handling operation after N first normal refresh operations occurring after the first row hammer handling operation are performed and, wherein the memory device is configured to perform a third row hammer handling operation instead of at least one of the N first normal refresh operations after an occurrence of a preset event, where N is a preset natural number.

14. The memory system of claim 11, wherein the memory device is configured to perform the row hammer handling operation based on a row hammer handling ratio between a performed number of normal refresh operations and a performed number of row hammer handling operations and the memory device is configured to adjust the row hammer handling ratio in response to an occurrence of a preset event.

15. The memory system of claim 11, wherein
the memory controller comprises a row hammer handler that is configured to determine whether to perform the first row hammer handling operation.

16. A method of refreshing a memory device comprising a memory cell array, the method comprising:
counting accesses to a particular area of the memory cell array and generating an access count, the particular area including all memory cell rows of the memory cell array or at least two memory cell rows of the memory cell array;
comparing the access count to a reference count; and
performing a row hammer handling operation to refresh adjacent memory cell rows that are adjacent to a first row of the memory cell array when the access count is equal to or greater than the reference count, or sequentially refreshing a plurality of memory cell rows included in the memory cell array when the access count is less than the reference count.

17. The method of claim 16, wherein the particular area is smaller than an entire area of the memory cell array.

* * * * *